(12) United States Patent
Trimberger et al.

(10) Patent No.: US 7,269,724 B1
(45) Date of Patent: Sep. 11, 2007

(54) REMOTE FIELD UPGRADING OF PROGRAMMABLE LOGIC DEVICE CONFIGURATION DATA VIA ADAPTER CONNECTED TO TARGET MEMORY SOCKET

(75) Inventors: Stephen M. Trimberger, San Jose, CA (US); Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 541 days.

(21) Appl. No.: 10/354,519

(22) Filed: Jan. 30, 2003

(51) Int. Cl.
*G06F 1/24* (2006.01)
(52) U.S. Cl. .................. 713/100; 703/28; 717/173
(58) Field of Classification Search ........... 703/28; 713/100; 717/173
See application file for complete search history.

(56) References Cited

U.S. PATENT DOCUMENTS

| | | | | |
|---|---|---|---|---|
| 5,212,774 A | * | 5/1993 | Grider et al. | 709/217 |
| 5,313,618 A | * | 5/1994 | Pawloski | 703/28 |
| 5,765,027 A | * | 6/1998 | Wang et al. | 710/40 |
| 5,766,563 A | * | 6/1998 | Tanaka et al. | 703/27 |
| 6,175,530 B1 | * | 1/2001 | Theron et al. | 365/201 |
| 6,314,529 B1 | * | 11/2001 | Rana | 714/29 |
| 6,690,719 B1 | * | 2/2004 | Raphaeli et al. | 375/222 |
| 2002/0095280 A1 | * | 7/2002 | Tung et al. | 703/24 |

OTHER PUBLICATIONS

Grammar Engine Inc., "PromICE", Sep. 2000.*
U.S. Appl. No 10/175,710, filed Jun. 19, 2002, Khu.
XILINX, Inc., *XC4000XLA/XV Data Sheet*, "The Programmable Logic Data Book 1999" Feb. 1, 1999, p. 6-166, (v. 1.0) available from Xilinx, Inc., 2100 Logic Drive, San Jose, CA 95124.

* cited by examiner

*Primary Examiner*—Chun Cao
*Assistant Examiner*—Albert Wang
(74) *Attorney, Agent, or Firm*—Scott R. Brown; LeRoy D. Maunu

(57) ABSTRACT

A method and apparatus are provided for updating or changing configuration data stored in the PROM of a target system, the data being used to configure one or more reprogrammable logic devices such as FPGAs. In one embodiment the apparatus comprises a modem used to communicate remotely with a host system, a shadow PROM for receiving new configuration data intended for use in a target system, an interface for relaying configuration data from the shadow PROM to the target, and means for controlling the components of the update system.

23 Claims, 2 Drawing Sheets

REMOTE FIELD UPGRADING OF PROGRAMMABLE LOGIC DEVICE CONFIGURATION DATA VIA ADAPTER CONNECTED TO TARGET MEMORY SOCKET

FIELD OF THE INVENTION

The present invention relates to remotely upgrading programmable logic device configuration data, and more particularly to a method and apparatus for changing programmable logic device configuration data for devices deployed in the field including those in systems that were not originally designed for remote upgrading.

BACKGROUND

Today's digital logic based electronic systems can have a logic complexity implemented in hardware comparable to the logic employed in software systems developed only a few years ago. Many such systems have achieved this complexity by relying on programmable logic devices (PLD) to perform data processing, manipulation, and control.

One consequence of implementing high complexity logic in hardware is that, as with complex software programs, it may be desirable to make logic changes subsequent to releasing finished designs into the market. Such changes may be dictated by the discovery of bugs in the logic design or by the necessity or desire to increase or change functionality of the systems after they have been deployed. PLDs that have the capability to be reprogrammed could be modified with such bug fixes, changes, enhanced functionality, or for many other reasons if a mechanism is available to deliver that new functionality to the PLD.

One category of PLD having this reprogramming capacity is the field programmable gate array (FPGA). FPGAs typically include an array of logic function generators or configurable logic elements, input/output ports, and a matrix of interconnect lines. The configurable logic elements are generally embedded in and connectable to the matrix of interconnect lines The input/output ports are usually located at the perimeter of the FPGA and are connectable both to interconnect lines and to external pins. FPGAs are configured by programming memory elements, such as static RAM cells, anti-fuses, EPROM cells, and EEPROM cells, which control configuration of the device. Depending on the programming of the memory elements, the configurable logic elements will perform different logic functions and be connected to each other and to the input/output ports in a variety of ways. In general, FPGAs also include programmable memory cells to configure other features on the IC. For instance, the routing of clock signals and the use of multiple clock nets on an FPGA is often programmably selectable by the user.

Static-RAM-cell based FPGAs are configured each time the system in which they reside is powered on. Such FPGAs can also be reconfigured by sending appropriately designed reconfiguration signals to the FPGA. In general, these static-RAM-cell based FPGAs rely on external memory devices comprising nonvolatile memory cells to hold the configuration data for the FPGA. These external nonvolatile memories supply that configuration data in response to signals generated by the FPGA or a controller that controls configuration of the FPGA.

Many systems incorporating reconfigurable FPGAs that rely on external nonvolatile memories to hold their configuration data have not been designed to allow changes in the configuration data stored in the nonvolatile memories. Thus, although the FPGAs have the inherent capacity to be reconfigured, once the FPGAs are designed into such systems the configuration data that determines the FPGA functionality is not easily changed. Because this configuration data typically resides in memories that are not in-system reprogrammable, a change in configuration data requires changing the nonvolatile memories residing in the system. Such systems are not amenable to remote updating/changing of configuration data.

It has been proposed that utilizing Internet Reconfigurable Logic (IRL) would be a viable technique to upgrade system hardware from a remote location. However, the hardware required for internet connectivity would most likely require complete system redesign and this would not be feasible or cost effective for many existing systems. Moreover, although many designers know that the capacity for remote updating can be designed into a system, these designers nevertheless elect not to provide such capability in the systems they are designing because of the inherent associated costs in hardware, software, and extra time to design and test such system functionality.

It is desirable then to provide a simple low cost method and apparatus for the remote updating of PLD configuration data for the large number of existing systems that were not designed with such remote updating capability. It is further desirable to provide a simple low cost method and apparatus for the remote updating of any PLD based system without the necessity of designing specialized hardware or communications protocols into the system containing the PLD(s).

SUMMARY

A method and apparatus are provided for updating or changing configuration data stored in the PROM of a target system, the data being used to configure one or more reprogrammable logic devices such as FPGAs. In one embodiment the apparatus comprises a modem used to communicate remotely with a host system, a shadow PROM for receiving new configuration data intended for use in a target system, an interface for relaying configuration data from the shadow PROM to the target, and means for controlling the components of the update system.

In one embodiment, new configuration data is loaded into the shadow PROM from a remote host system via the modem. When the target system is powered on or reset, signals generated to retrieve configuration data for the reprogrammable device(s) on the target system cause configuration data retrieval through the interface from the shadow PROM, thus substituting the new configuration data for old data.

In a separate aspect, the modem has a controller that calculates a CRC check sum to verify new configuration data integrity. In another aspect, the system may be provided with a method for verifying the source of the new configuration data by requiring a caller identifier password, which allows verification of the data source. In another aspect, logic functions of the modem may be incorporated in the controller, obviating the need for a separate modem. In another aspect, the shadow PROM may be internally partitioned, or a second shadow PROM is provided to allow for double buffering. By maintaining a configuration source file known to work in one buffer and downloading a new update file to the second buffer, the known good file may be restored to the target system if the update file is found not to work. In yet another aspect, the system may be provided with a PROM controller capable of decompressing a compressed bitstream received by the modem prior to writing data to the shadow PROM. Alternatively, the system may have an interface controller capable of decompressing configuration data bits received in compressed format from the shadow PROM prior to transmitting them through the interface to the target system. In still another aspect, the host system may use the update apparatus as a means to query or test the target system, or to collect target system information. These and other advantages of the disclosed embodiments will be apparent after reference to the drawings and detailed descriptions thereof.

DETAILED DESCRIPTION

Figure 1:
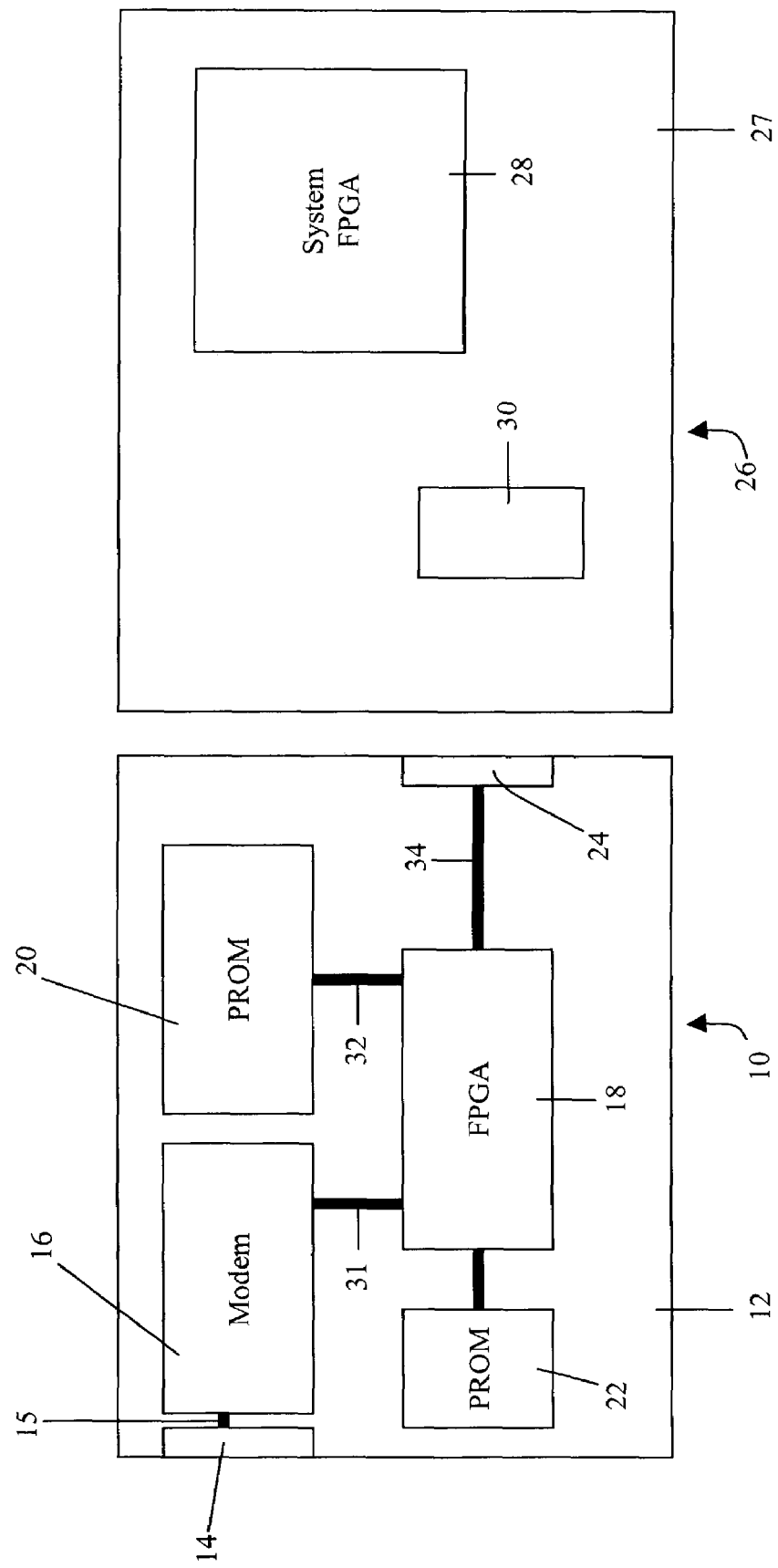
FIG. 1 is a block diagram showing an embodiment of an update system of the present invention and a target system used therewith.

FIG. 1 is a block diagram showing a configuration data field upgrading system 10 of one embodiment of the present invention. In the depicted embodiment, the upgrade system 10 resides on a daughter card 12. The elements residing on the daughter card 12 include a modem port 14, a modem 16, a FPGA 18, a programmable read only memory (PROM) 20, a PROM 22, and a data interface port 24.

Also shown in FIG. 1 is a target system 26. Target system 26 includes system board 27, a system FPGA 28, and a PROM socket 30 in the system board. As originally designed, target system 26 performs a specified function and utilizes system FPGA 28 to perform some or all of that function. There may be many other components in system board 27 that make up the target system, including other programmable logic devices. FPGA 28 in turn relies on data applied to PROM socket 30 for its configuration data, which it retrieves upon system power up or reset.

Using the upgrade system 10, target system 26 can have its configuration data, which defines the functions of FPGA 28, remotely upgraded by replacing the PROM formerly fit into PROM socket 30 with a connection cable or other interface device that connects upgrade system 10 into PROM socket 30. Target system 26 may alternatively have the functional components of daughter card 12 integrated into its original design. As will be described below, upon system power up or upon reset of target system 26, the signals formerly used to retrieve configuration data from the PROM in socket 30 will be sent through the interface to daughter card 10 and ultimately to PROM 20. Data stored in PROM 20 will be used to configure system FPGA 28.

Remote Upgrade System

Upgrade system 10 is constructed as follows. In a preferred embodiment, daughter card 12 is a standard printed circuit board that is designed to be as small as possible given its components and electrical traces required to connect those components together. Because daughter card 12 is intended to be permanently or semi-permanently connected to target system 26, a small size will be easier to combine with target system 26. Modem port 14 can be any standard phone jack such as an RJ-11C. Modem 16 is connected to port 14 via bus 15. Modem 16 may be any commercially available modem such as a Cermetek CH2056, that is capable of using standard modem protocol file transfer programs such as Y-modem and X-modem.

FPGA 18 is connected to modem 16 via data and control bus 31, and is programmed to contain a UART or other modem controller to control modem operation. FPGA 18 is connected to PROM 20 through data and control bus 32. FPGA 18 is configured to control the writing of data into PROM 20. FPGA 18 is connected to interface port 24 through data bus 34. PROM 22 holds the configuration data file for FPGA 18 and supplies that data in response to clock and control signals generated at system power up or reset.

In the depicted embodiment, FPGA 18 is programmed as a modem controller, PROM controller, and data interface controller. Although the controllers are programmed into a single FPGA, they may also be implemented in any combination of PLDs, ASICs, microcontrollers or other appropriate hardware and software combinations as are well understood by one of ordinary skill. In a preferred embodiment, FPGA 18 is a Xilinx 2S10 FPGA, with a Xilinx 1802 SPROM nonvolatile memory 22 connected to it to hold its configuration data. A ribbon cable with a plug compatible with data interface port 24 on one end and PROM socket 30 on the other end may be used to electrically connect daughter card 12 to system board 27.

Power for upgrade system 10 may be obtained through port 24 by relying on the power pins designed into system board 27 from PROM socket 30. Upgrade system 10 may also include a DC-to-DC power converter (not shown) to ensure the voltage level of power received through port 24 is shifted to the correct voltage to operate upgrade system 10. Alternatively, an independent power supply may also be provided to system 10 as is well understood in the art.

As will be appreciated by one of ordinary skill in the art, upgrade system 10 may also be integrated into the original design of target system 26 without departing from the scope of the invention.

Installation

For those target systems that do not have the upgrade system integrally designed into them, the upgrade system may be installed into an existing system in the field by removing the appropriate configuration data PROM in target system board 27 and plugging the ribbon cable plug with the associated PROM pin-out into the system board. The daughter card itself can be attached into the existing product in any way desired by the user such that modem port 14 will be accessible to a telephone line. A telephone line should then be plugged into modem port 14 and upgrade system 10 will be ready for use as soon as power is supplied to the system.

Operation

Upgrade system 10 has two main modes of operation; receive mode and shadow ROM mode. Receive mode is entered when a phone call comes in on the phone line connected to the modem port. FPGA 18 detects the phone call through modem 16 and causes the modem to answer the phone, or the modem can be in auto answer mode. Upon answering the phone, the FPGA waits for the caller to give an authentication password. The password is transmitted to the modem and over lines 31 into FPGA 18 where it is compared to the authorized password for use with the particular system. The authorized password is stored in PROM 22 and loaded into the FPGA when the FPGA is about to be configured. If the password is correct, the FPGA replies with its identification password, which is sent by modem 16 through port 14 back to the caller. The caller can use this identification password to verify that the caller has reached the proper system.

In one embodiment, the configuration data is transmitted in standard Xilinx.bit file format using a simple standard X-modem protocol. A Xilinx bit file format is described in "The Programmable Logic Data Book 1999 on a XC4000XLA/XV Data Sheet dated Feb. 1, 1999 at page 6-166, which is incorporated herein by reference and is available from Xilinx, Inc., 2100 Logic Drive, San Jose, Calif. 95124. Every 4 k-bit block of data is received by the modem, transmitted to FPGA 18, and then programmed into PROM 20 by FPGA 18. This programming step is completed before the next 4 k-bit block of data is accepted by FPGA 18. This process continues until the entire new configuration data file is programmed into PROM 20. PROM 20 may be optionally queried for data readback to ensure the accuracy of the data now encoded in PROM 20. The call is then terminated.

In one embodiment, as each 4 k-bit block of data is sent to modem 16 and processed by FPGA 18, a CRC is calculated. When the complete bitstream has been sent, the CRC is verified and the result sent back to the caller. This allows the caller to verify successful transfer of the configuration data update.

Figure 2:
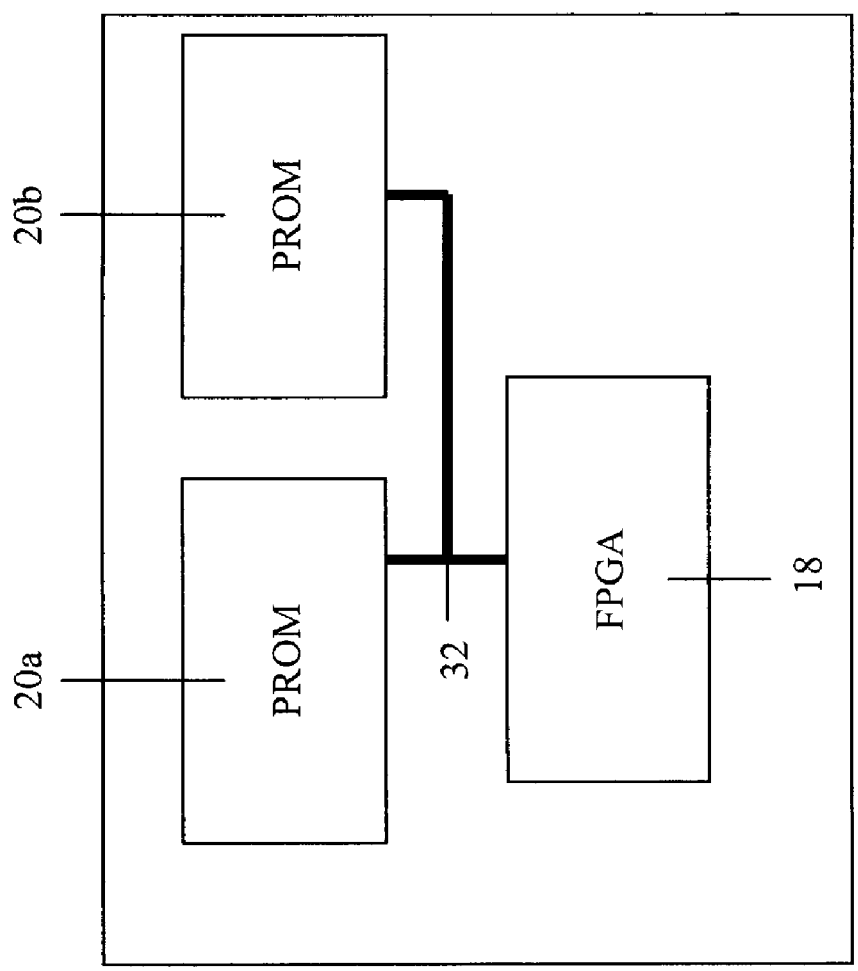
FIG. 2 is a block diagram showing an embodiment of an update system of the present invention.

Turning to FIG. 2, a portion of a second daughter card arrangement is shown. In this figure there are two shadow PROMs 20a and 20b on daughter card 12 allowing for double buffering of configuration data, whereby an existing configuration data file may be retained while a new update is downloaded to the upgrade system. By providing two shadow PROMS, two separate memory areas are created. One memory area holds the current and active configuration file. The second memory area is where the new file is written. After the new file is verified to correctly operate in the target system, the second memory area will be designated as the active memory area in place of the first memory area. The first memory area will then be available for future updates. FPGA 18 will be appropriately programmed to control which shadow PROM memory area is utilized to supply configuration data to target system 26. If the new configuration file in the second memory area does not correctly cause FPGA 28 to perform the desired functions, the active configuration file in the first memory area will continue to be used. In this way, the user can "undo" a configuration data update if target system 26 was not operating correctly after the update was made or an error in programming of the PROM occurred. As will be appreciated by one of ordinary skill, a single PROM with sufficient memory capacity to hold two configuration files may also be logically partitioned to create a double buffered memory as described above.

In still another embodiment, the modem controller is programmed to receive a compressed configuration data bitstream from modem 16, which has been transmitted by the user. FPGA 18, using well-known decompression algorithms, decompresses this data prior to writing the data into PROM 20. Alternatively, FPGA 18 can be programmed to program PROM 20 with the compressed data bitstream and decompress that data stream in the process of transmitting the data from PROM 20 to target system 26, again using well-known decompression algorithms. Methods for compressing and decompressing data are described by Khu in U.S. patent application Ser. No. 10/175,710, titled "Hardware-Friendly General Purpose Data Compression/Decompression Algorithm" which is incorporated herein by reference.

In still another embodiment, shadow PROM 20 under control of FPGA 18 may also be used to record access attempts to update or change the shadow PROM configuration file. By recording access attempts in PROM 20, the host system can check the number of attempts by querying shadow PROM 20 through FPGA 18 and can compare access attempts against its own recorded access attempts. This may provide information about unauthorized attempts to change the configuration file.

Upgrade system 10 may also be used in an auto-callback mode. In this mode, the modem may dial back to the host system or factory on a periodic basis to report system information that has been recorded by the upgrade system 10, as described in more detail below. Alternatively, alarm conditions may be set that when activated cause the upgrade system 10 to call back to the host system or factory to report on an alarm condition. Examples of such conditions would include a defined excessive number of reconfiguration attempts, an excessive number of dial access attempts, and various system issues including external sensor errors, excessive system activity and others. Other alarm conditions are possible and will be obvious to those of ordinary skill in the art.

The second mode of operation for upgrade system 10 is shadow PROM mode. In this mode, FPGA 18 controls the connection between PROM socket 30 and shadow PROM 20 through port 24. When system 26 is powered on or system FPGA 28 is reset, FPGA 28 or its configuration controller (not shown) will send control signals to PROM socket 30. These control signals would originally have been used to retrieve configuration data from the PROM designed into system 26 and located in PROM socket 30. The same signals will now be sent through a connection cable or other interface device to data interface port 24 and ultimately to FPGA 18. In one embodiment, FPGA 18 will simply pass these signals on to shadow PROM 20 and the same signals used originally in system 26 are then used directly in update system 10 to retrieve configuration data from PROM 20 through lines 32 to FPGA 18 through lines 34 to interface port 24 and ultimately into target system FPGA 28. In this way, the substitute configuration data file is used in the target system.

Alternatively, the signals generated by FPGA 28 and received by FPGA 18 will be converted by FPGA 18 into the appropriate signals to retrieve data from PROM 20 if, for instance, PROM 20 is of a different variety than the PROM originally designed for PROM socket 30 in system 26.

The above described upgrade capabilities may be used for other functions in addition to providing a new configuration file to the target system. For example, many commercially available FPGAs embody a rich compliment of JTAG capabilities. Thus, a configuration file may be downloaded for the purpose of using the JTAG boundary scan and in-circuit configuration capabilities of the FPGA to query status within the FPGA of the target system itself. Likewise, these capabilities may be used so that the target FPGA queries other elements on the target system board to check system status and functionality. These tests may then be reported back to the host system via the modem in the upgrade system. Thus, remote JTAG testing of the target system by the host system is also possible by utilizing the upgrade system of the present invention.

The above description of the invention is intended to be illustrative and not limiting. Other embodiments of this invention will be obvious to those skilled in the art in view of the above disclosure.

What is claimed is:

1. A system for remote changing of programmable logic device configuration data comprising:
   a connector for interfacing with a target system;
   a modem;
   a modem controller;
   a memory for storing configuration data received from the modem, the memory communicating with the connector and being capable of providing configuration data to the target system;
   wherein the target system includes a field programmable gate array (FPGA), and the configuration data is for configuring the FPGA;
   a data interface controller capable of routing control signals from the target system to the memory and routing data from the memory to the target system, wherein at least one FPGA comprises the modem controller and the data interface controller;
   wherein the connector comprises an interface having a form factor to connect into the target system at a location designed to hold a configuration data memory device from which the FPGA inputs configuration data;
   wherein the data interface controller routes configuration data from the memory to the FPGA on the target system via the connector in response to the control signals from the target system.

2. The system of claim 1 wherein power is received through the connector from the target system.

3. The system of claim 1 wherein the modem controller performs a CRC check of configuration data received by the modem.

4. The system of claim 1 wherein the modem controller authenticates the source of telephone transmissions to the modem by comparing a transmitted caller identifier to a stored authorized caller identifier.

5. The system of claim 1 wherein the memory is a double buffered memory capable of storing at least two configuration data files.

6. The system of claim 1 wherein the data interface controller is capable of generating control signals to be sent to the memory in response to control signals received from the target system and routing data from the memory to the target system.

7. The system of claim 1 wherein the data interface controller is programmed to decompress configuration data received from the memory prior to sending the configuration data through the connector to the target system.

8. The system of claim 1 further comprising a memory controller wherein the memory controller receives compressed configuration data from the modem and decompresses the configuration data prior to writing it into the memory.

9. The system of claim 1 wherein the connector includes a second interface for inducing a FPGA in the target system to reset and reconfigure.

10. The system of claim 1 wherein at least one FPGA comprises the modem and modem controller.

11. The system of claim 1 wherein the interface comprises pins that substantially correspond to pins of the configuration data memory device.

12. The system of claim 1 wherein the connector is a selected one of a plurality of connectors, each having a different form factor, and wherein the selected connector can be coupled to the memory.

13. The system of claim 12 wherein the connector can be decoupled from the memory.

14. A method for changing programmable logic device (PLD) configuration data stored in a target system comprising the steps of:
   providing a modem;
   providing a programmable memory;
   attaching a connector to the target system at a location designed to hold a configuration data memory device, wherein the connector comprises pins that substantially correspond to sins of the configuration data memory device;
   sending a configuration data file comprising configuration data from a host to the modem and storing the configuration data file in the programmable memory,
   wherein the programmable memory has a first and second memory segment and wherein the step of sending and storing comprises storing the configuration data file in the first memory segment;
   providing the configuration data file in the programmable memory to the target system at system power up;
   wherein the step of providing the configuration data file includes providing data signals via the connector in response to control signals from the target system, wherein the data signals are consistent with the configuration data memory device;
   wherein the configuration data file programs the PLD in the target system at power up of the target system; and
   wherein the step of sending the configuration data file further comprises performing a CRC check sum of the configuration data and providing that CRC check sum to the host.

15. The method of claim 14 further comprising the step of providing the configuration data file in the programmable memory to the target system via the connector at system reset.

16. The method of claim 14 further comprising the step of decompressing the configuration data prior to storing the configuration data in the programmable memory.

17. The method of claim 14 further comprising the step of decompressing the configuration data in the programmable memory prior to providing the configuration data to the target system.

18. The method of claim 14, further comprising the step of utilizing the configuration data to test the target system and sending test results to the host through the modem.

19. The method of claim 14 further comprising the step of recording attempts to access the modem in the memory and reporting the recorded attempts to access to the host.

20. The method of claim 14 further comprising the steps of:
   verifying correct operation of the programmable logic device (PLD) when programmed with the configuration data from the first memory segment in the target system;
   designating the first memory segment as active in response to the PLD operating correctly when programmed with the configuration data from the first memory segment;
   sending a second configuration data file and storing the second file in the second memory segment;
   programming the PLD in the target system with the configuration data file from the second memory segment;
   verifying correct operation of the PLD when programmed with the configuration data from the second memory segment; and
   retrieving the configuration data file from the first memory segment to program the PLD on the target system in response to incorrect operation of the PLD when programmed with the configuration data from the second memory segment.

21. The method of claim 20 further comprising the step of designating the second configuration data file in the second memory segment as active in response to the PLD operating correctly when programmed with the second configuration data file from the second memory segment.

22. The method of claim 14 wherein the step of attaching comprises replacing a PROM holding the programmable logic device configuration data stored in a target system with the connector.

23. The method of claim 14 further comprising decoupling the connector from the programmable memory.

* * * * *